United States Patent [19]

Wixon

[11] Patent Number: 5,001,432
[45] Date of Patent: Mar. 19, 1991

[54] IGNITION TEST PROBE

[76] Inventor: Glenn H. Wixon, 10645 Art Street, Sunland, Calif. 91040

[21] Appl. No.: 509,888

[22] Filed: Apr. 16, 1990

[51] Int. Cl.$^5$ .............................................. F02D 17/00
[52] U.S. Cl. ..................................... 324/402; 324/384; 324/395; 324/399; 73/117.3
[58] Field of Search ............... 324/393, 395, 396, 399, 324/402, 658, 686, 690, 536; 73/117.3, 116

[56] References Cited

U.S. PATENT DOCUMENTS

| | | | |
|---|---|---|---|
| 3,711,767 | 1/1973 | Campbell, Jr. et al. | 324/539 X |
| 3,763,421 | 10/1973 | Glomski | 324/395 |
| 4,041,373 | 8/1977 | Maringer | 324/402 |
| 4,349,782 | 9/1982 | Doss | 324/395 X |
| 4,783,991 | 11/1988 | Wixon | 324/384 X |
| 4,825,167 | 4/1989 | Bayba | 324/399 |

*Primary Examiner*—Reinhard J. Eisenzopf
*Assistant Examiner*—Robert W. Mueller

[57] ABSTRACT

A self-contained handheld peak ignition breakdown voltage probe locates faulty sparkplugs in an internal combustion engine. The probe has a novel dual-polarity detection system suitable for all ignition systems, distributorless or distributor types. Each nanosecond peak breakdown ignition event is signalled by a high-intensity LED lamp lit for a fixed period of time. An adjustable calibrated threshold level provides precise control of acceptance level. Other problems such as cabling, plug gap, and relative compression may also be inferred. The simple arrangement of integrated circuits provides a novel and useful tool for locating ignition problems.

3 Claims, 2 Drawing Sheets

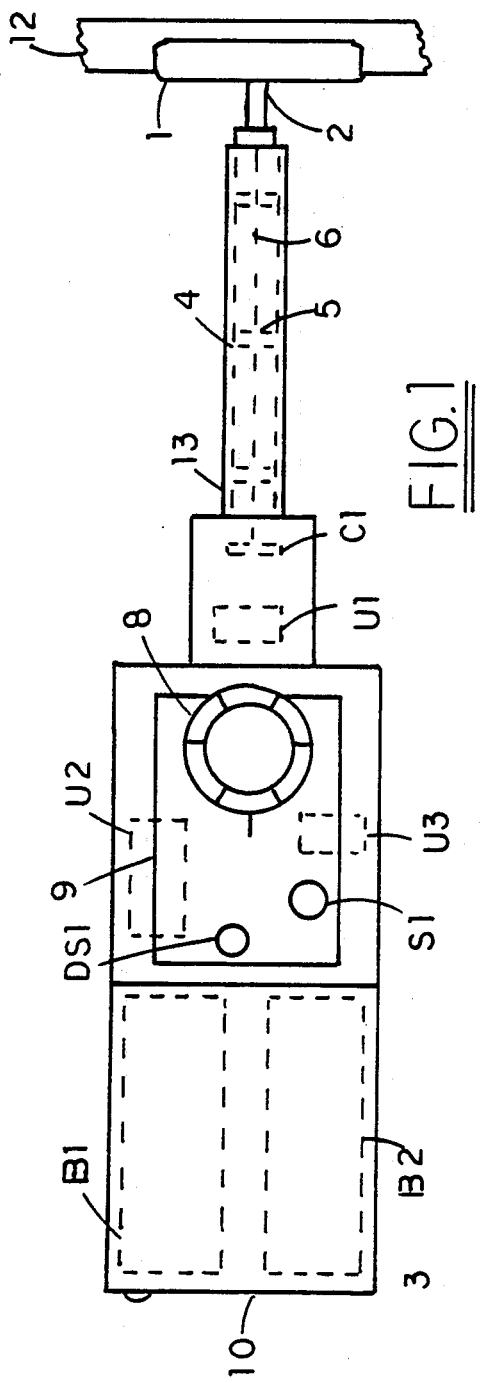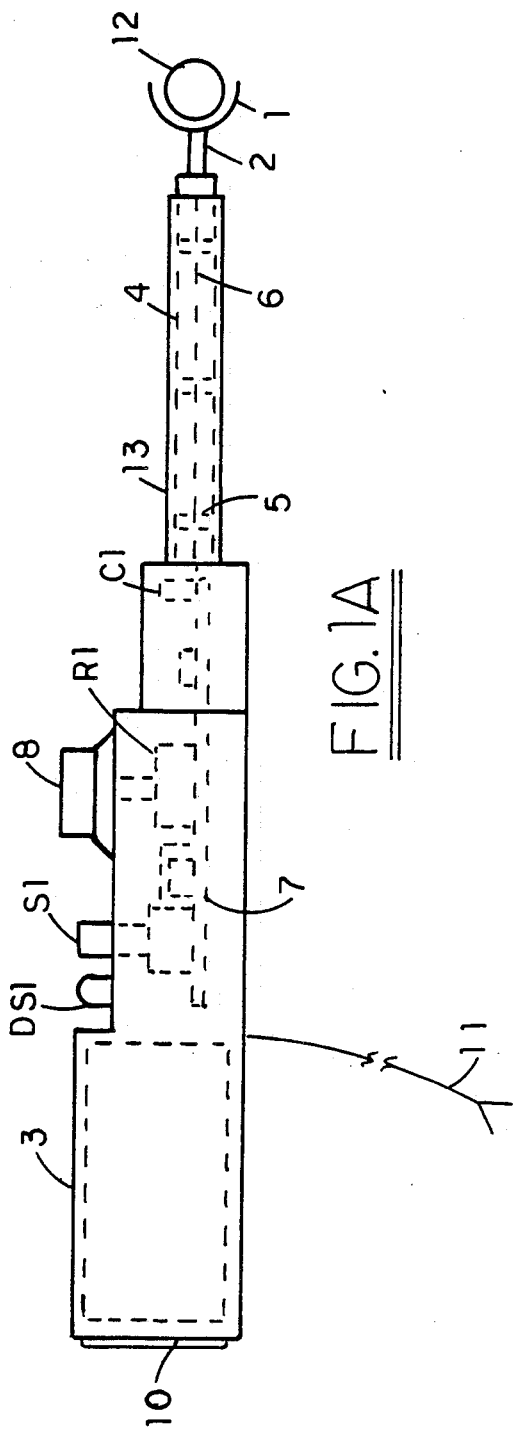

IGNITION TEST PROBE

FIELD OF THE INVENTION

This invention relates to the detection of faulty sparkplugs in the ignition system of an internal combustion engine. Indirectly, it also provides a check on harness wiring, sparkplug gap, and relative engine compression.

PRIOR ART

The only known prior art for the intended field of use was the use of neon lamps which generally require a metal-to-metal contact for illumination. Neon does not provide any value indication, cannot be depended on to ignite at all times, and is not bright enough when it does. The Engine Analyzer oscilloscope also provides a similar test. This analyzer is expensive and requires expertise in use.

SUMMARY OF THE INVENTION

The invention is a compact self-contained handheld probe. A capacitive pickup carries the fast rising and falling ignition pulse from an individual sparkplug to the probe for peak level detection. The accepted level is displayed by a calibrated dial adjusted by observing an acceptance point signalled by an high-intensity LED lamp which illuminates for a fixed time longer than the original pulse. The combination of said LED and said fixed time provides an indication usable in bright sunshine. The unique arrangement makes the probe especially useful in locating faults in distributorless ignition systems as the probe responds to either a positive or negative peak polarity.

BRIEF DESCRIPTION OF THE DRAWINGS

FIG. 1 is a drawing of the general appearance of the unit.

DESCRIPTION OF A PRECISE EMBODIMENT

Figure 2:
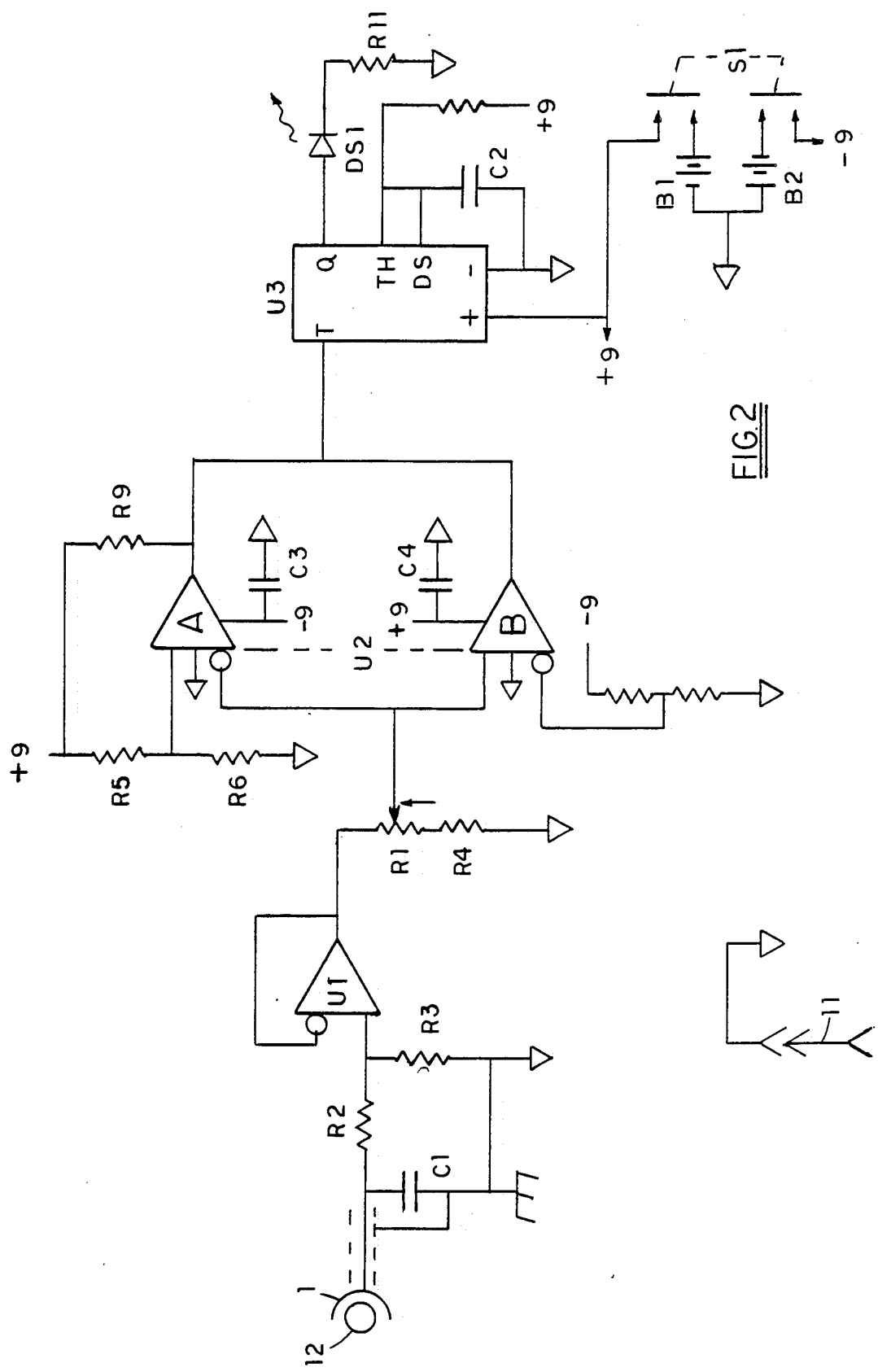
FIG. 2 is a schematic of all of the self-contained components used and their interconnections.

The compact handheld self-contained spark ignition peak voltage detecting proximity probe is shown in FIG. 1. The overall length is approximately eight inches. The electronic components are mounted on circuit board 7. Access to this board is through door 9. Battery access for B1 and B2 is through door 10. The circuit board and batteries are all mounted within the form shown which in this arrangement is a plastic body 3. An inner shield 4 is contained within the housing probe portion. Its purpose is to reduce stray pickup from undesired nearby high-voltage sources. Of course, other physical configurations for the probe may be made. The selection of components generally dictates the final physical form.

Experience gained in developing U.S. Pat. No. 4,783,991 established the prime requirement, for any peak voltage sensing system, as that of first obtaining an undistorted scaled analog waveform. The waveforms at the sparkplug are different from those at the voltage source in distributor systems. No voltage passes to the sparkplug until breakdown of all of the gaps in the system. As a result, the peak voltage rises to breakdown and the ensuing spark is very abrupt with a short-term peak lasting about 50 nanoseconds. Such a fast pulse is easily transmitted through a low value capacitance, which is approximately 5 pF, Item 1 in the figures whose physical dimensions are a semi circle of ¼ inch radius copper conductor approximately 1 and ½ inch long. Distributorless systems behave in a similar manner because they use two sparkplugs in series. One of the sparkplugs acts electrically the same as a distributor gap.

The complete assembly of FIG. 1 shows the major components and is further described as follows:

Capacitive coupling means for said ignition peak ignition voltage comprise capacitive probe 1, and 2 a swivel joint mechanical support electrical connector to probe extension 13. Wire 6 carries the signal to the undistorted low level analog attenuator means. The inside of the probe housing 13 contains a signal ground shield 4. Insulating spacer 5 secures the connecting wire 6 from 1 to board 7 and insures a coaxial arrangement. A ground lead and a clip lead connector 11, complete the circuit and insure accuracy. Good results were obtained without the ground connection because of body capacity return and the high impedance probe coupling. Highest accuracy is obtained with the ground connection. 12 is the ignition system's sparkplug cable reference showing the manner of coupling for test.

Means for producing an undistorted low level analog of said peak ignition voltage comprise the previous coupling means with the addition of a 60 pF capacitor C1 and resistors R2 and R3. Noninductive resistors must be used here to eliminate reactive effects which would distort the signal. The ratio of the resistors, R2 & R3, is chosen for approximately seven volts peak level into U1 and an overall value of around 2 Megohms. The constraints here are that the peak level not exceed the supply voltages, +9 and −9 Volts, on U1. The attenuated signal should be as high as possible in the detecting range. The reason for this is that when differentially detected in the comparators at U2, the highest expanded scale of detection is then possible. A lower signal level, i.e., one volt, would reduce the detection accuracy by one-seventh. Scaling at low values reduces accuracy, and scaling is a compromise with the system voltages.

The undistorted analog means at the junction of R2, R3 connect to an isolation amplifier means of said undistorted analog. This isolated means comprises U1, a Texas Instrument TL051, connected as a voltage follower. The amplifier used must have a very high input impedance which an FET input type easily accomplishes. This does not distort the waveform from the high resistance attenuator output R3. The 100% feedback inverted connection provides a low impedance output to the expanded manual controlled attenuation means of said isolated analog comprising R4 fixed in value, variable R1, and calibrated scale dial 8 in FIG. 1. Dial 8 is calibrated in peak kilovoltage. In FIG. 2, R1 is 1 Kohm as is R4. This provides an expanded manually controlled attenuation means for greatest accuracy and control. If U1 were not used, the loading and reactive effects of R1, an ordinary potentiometer, would give an unreliable signal.

Absolute duel comparator means responsive to a selected level of said manually controlled calibrated attenuation means comprise U2A and U2B, an LM319 high speed dual comparator, arranged for individual polarity processing. U2A has a negative reference voltage established by R7 and R8 of −6 Volts. When a voltage of a 5 to 10 millivolts more negative than this reference is seen at U2A noninverting input, U2A, output will be pulled low through the common wired OR resistor at R9, 1K ohm. In a like manner, U2B detects the +6 Volt reference at the juncture of R5, R6 except that now a positive peak over +6 Volts is detected, U2B output is again pulled low through resistor R9. The result is that either a negative or positive peak will provide a low signal necessary to trigger the following monostable U3.

The expanded calibrated dial means at 8 and R1 controls the expanded manually controlled attenuation means of R4 and R1 to provide the range of acceptance levels for the comparators. The scale of adjustment on R1 is being expanded over the range of interest by low output limit of R4. In this unit, R1 is 1K and R4 is also 1K for twice the dial expansion over the voltage of interest. An alternate method would be to fix the input and vary the references. The arrangement shown provides a desired single control. The requirement is that both references be set with their fixed resistances for the same absolute voltage level.

An arrangement with the resistive controlled attenuator feeding directly into the comparators was tried and worked but did not have the accuracy desired. The small added cost of U1 was well worthwhile. An object of this invention is to provide a low-cost method of achieving reliable accurate results. This unit achieves a resolving ability of 100 volts out of the usual 6000 volts needed for sparkplug ignition initiation. The actual voltage during sparking is less than 100 volts. When a plug is a dead short, the voltage on nonresistor sparkplugs will be close to zero and is easily detected. Resistor plugs only change at 30% to 40% reduction in breakdown voltage and gap variations are usually in the order of 10% to 20%, as are cylinder compression variations. To adequately detect these changes, the resolution of my unit is needed.

The reason for both polarity detections is to accommodate the new distributorless ignition systems. In order to reduce the number of transistors in these systems, one coil is used with two plugs connected in series across opposite ends of the high voltage side of the coil. The ground is provided by the common engine connection of plugs. As a result, one voltage will swing positive and the other negative. My unit detects either, detecting any system regardless of polarity. The absolute comparator is sometimes referred to in literature as a window detector. The uniqueness here is in the application.

Fixed pulse time means responsive to said absolute dual comparator means comprise U3, a 555 monostable multivibrator; and the combination of R10 and C2, from the formula T=1.1RC, for a 3 mS pulse width. This effectively changes the breakdown pulse width of around 50 nS to one of 3 mS. U3 connected to the comparators outputs a pulse every time the comparator decision level is reached which is signalled by the low level pulse of either comparator.

High-intensity light means responsive to said fixed pulse time means comprise DS1, a Hewlett Packard HLMP-4101 AlGaAs high-intensity LED lamp, capable of being seen in bright sunlight, and the connecting U3 and R11. The current through the lamp was set by R11 which is 500 ohms for high brightness and its source is from U3. The constraints for the ON time for the lamp are governed by the duration time for desirable viewing and a lesser time needed to avoid persistence of vision which makes the lamp appear to be constantly ON. Originally 6 mS was used, but this needed reducing to 3 mS. Even a moderate engine speed caused the 6 mS time to appear as a constant ON light although a scope check showed it to be more off than on.

The normal usage of the probe is to couple to a selected sparkplug cable and adjust R1 for repeated flashings of DS1. The arrangement provides a means for operator detection of the ignition peak voltages through correlation of the expanded manually controlled attenuator threshold and the high intensity light means controlled as previously described. The dial can then be read for the approximate high-voltage level. Optionally, the dial reading is skipped as flashing light plug comparisons are most useful. A short period of observation at each plug will also show an intermittent firing plug by the absence of regular flashing during the observation period.

Batteries were chosen for the unit to reduce its complexity. These are low-cost 9-volt transistor batteries. Capacitors C3, C4 are required and mounted near U2. These are 0.047 uF types. High value electrolytics are inadequate for the high-speed pulses involved. Swicth S1 controls the application of battery power. A spring-loaded return swicth assures long life of batteries, probably equal to shelf life. The reference voltage will drift with the battery voltage. This drift could be eliminated by the addition of voltage regulators. It does not affect the utility of the probe. With costs in mind, regulators were not used. An additional use of the probe is in the detection of spark breakdown level variations between sparkplugs. This indicates that if all plugs have the same gap and are of the same type, relative cylinder compression can be determined. Lower breakdown voltage indicates lower compression.

This unit can also be built with its power coming from the car battery. This requires regulators and DC to DC converters for the negative supply. For cost effective reasons, the car battery was not implemented in this design. But its use is not precluded using standard readily available components.

This probe was developed because of the need for a quick and easy ignition check. In distributor types, only one polarity is present so that one comparator and battery could be eliminated if only this system is to be checked. As described, the probe has universal application. The identification of a faulty plug is immediately determined because the test is made with the probe coupled to a specific sparkplug. The simplicity of the arrangement provides a low-cost effective probe analyzer.

I claim:

1. A compact dual polarity handheld self-contained active proximity electrical peak voltage signal detecting probe comprising:

capacitive coupling means for coupling the probe to a sparkplug cable to sense said ignition peak voltage signal;

an undistorted low level analog means of said ignition peak voltage signal comprising a resistive capacitive network connected to said capacitive coupling means providing an undistorted low level analog signal wherein the resistors of said network are noninductive resistors;

an isolation amplifier means responsive to said undistorted low level analog signal to provide an isolated signal output;

an expanded manually controlled attenuation means connected to said isolation amplifier output providing an expanded controlled level signal of the isolated analog signal whereby precise control of signal level is obtained;

an absolute dual comparator means having dual polarity references and dual polarity inputs, wherein said dual polarity inputs are connected to said expanded manually controlled calibrated attenuation means to provide common output magnitude comparisons independent of said ignition peak signal polarity;

a fixed pulse time means responsive to an output of said absolute dual comparator means to provide a fixed pulse time when the controlled level signal exceeds either dual polarity reference level;

an high intensity light means responsive to said fixed pulse time means providing a visual indication of said ignition peak voltage signal said ignition peak voltage signal are converted to millisecond light signals suitable for daylight viewing.

2. The devices of claim 1 further comprising:
an expanded manually calibrated dial means controlling said expanded controlled attenuation means providing indications of relative level of said ignition peak voltage signal, said relative level being signalled by adjustment of said expanded calibrated dial and said high intensity light means whereby highest accuracy is obtained.

3. The device of claim 1 further comprising:
a means for operator detection of said ignition peak voltages comprising operator adjustment of said expanded manually controlled attenuation means for display of said high intensity light means responsive to said absolute comparator whereby the signal detected by the probe is independent of said ignition system polarity and is particularly useful in the test of dual polarity nondistributor ignition system.

* * * * *